United States Patent [19]

Ibok et al.

[11] Patent Number: 5,698,473

[45] Date of Patent: Dec. 16, 1997

[54] METHOD FOR FORMING A SILANE BASED BORON PHOSPHOROUS SILICATE PLANARIZATION STRUCTURE

[75] Inventors: Effiong E. Ibok; John D. Williams, both of Austin, Tex.

[73] Assignee: Advanced Micro Devices, Inc., Sunnyvale, Calif.

[21] Appl. No.: 213,943

[22] Filed: Mar. 16, 1994

[51] Int. Cl.$^6$ ............................................. H01L 21/316
[52] U.S. Cl. ............................................. 437/240; 437/982
[58] Field of Search ............................. 437/238, 240, 437/982, 236

[56] References Cited

U.S. PATENT DOCUMENTS

| | | | |
|---|---|---|---|
| 4,154,873 | 5/1979 | Hickox et al. | 427/82 |
| 5,244,841 | 9/1993 | Marks et al. | 437/228 |
| 5,350,486 | 9/1994 | Huang | 156/633 |
| 5,354,695 | 10/1994 | Leedy | 437/7 |
| 5,389,581 | 2/1995 | Freiberger et al. | 437/238 |
| 5,409,743 | 4/1995 | Bouffard et al. | 427/579 |
| 5,438,023 | 8/1995 | Argos, Jr. et al. | 437/235 |

*Primary Examiner*—Robert Kunemund
*Assistant Examiner*—Matthew Whipple
*Attorney, Agent, or Firm*—Kevin L. Daffer; Conley, Rose & Tayon

[57] ABSTRACT

An improved process is provided for forming a highly planar BPSG interlevel dielectric. The process includes using a silane based source material placed within a plasma enhanced CVD chamber. The plasma enhanced CVD chamber undergoes high energy plasma deposition by applying an RF energy exceeding 950 watts in order to minimize formation of silicon-rich intermediates upon the semiconductor substrate. Moreover, densification of the BPSG material occurs within an oxygen ambient to enhance the formation of silicon dioxide having a flow angle substantially less than lower power, non-oxygen densified processes. Still further, BPSG can, if desired, be selectively etched to form a more planarized topography or a possibly recessed topography. Selective etching is brought about by a photolithography mask used to form the underlying conductors.

21 Claims, 5 Drawing Sheets

METHOD FOR FORMING A SILANE BASED BORON PHOSPHOROUS SILICATE PLANARIZATION STRUCTURE

BACKGROUND OF THE INVENTION

1. Field of the Invention

This invention relates to integrated circuit manufacture and more particularly to a silane based boron phosphorous silicate structure deposited from a high energy plasma and densified in the presence of oxygen to form a highly planar interlevel dielectric.

2. Description of the Relevant Art

Due to the nature of semiconductor processing, a semiconductor wafer is often formed having an "uneven" surface. The uneven surface is generally the result of numerous processing steps involving densely patterned structures selectively deposited and etched upon the wafer topography. The uneven surface results in a substantial disparity between the peaks and valleys of adjacent structures. For example, the upper surface of a polysilicon structure may be substantially raised above an adjacent substrate surface on which the polysilicon is formed. If the disparity becomes severe, step coverage problems can exist when overlying conductors are placed upon and between the structures. Moreover, a depth of focus problem can also occur which causes a subsequent layer placed at valley locations to be out-of-focus with raised locations.

Extensive work has been performed to planarize the substrate upper surface in order to alleviate or minimize many problems associated therewith. Oftentimes planarization techniques involve a subtractive process. By subtracting or selectively removing the peak areas of a dielectric formed across the structures, the resulting dielectric is made more planar than its original configuration. Selective removal of peak dielectric areas generally involves a mechanical or chemical polish of the wafer surface. Polishing can often leave contaminants or by-products on the wafer surface. Subsequent deposition steps can trap the contaminants thereby causing deleterious electrical effects in the operation of the ensuing device. Removal of peak areas can be removed without a polishing step by spinning a photoresist over the dielectric and removing the photoresist and dielectric at substantially the same rate. Peak areas are removed before recessed areas due to thinner amounts of photoresist upon the peaks than the valleys.

For many of the reasons stated above, the subtractive process of planarizing a dielectric layer should be avoided. It would be advantageous to planarize the dielectric during its formation rather than having to planarize after the dielectric is formed. It would also be advantageous to select a composition and a process for forming the dielectric in order to provide a more planar dielectric during its formation. A difficulty exists, however, in selecting a proper composition and methodology for performing the planarized result.

There are numerous compositions used to form a dielectric, and there are numerous dielectrics placed at varying locations upon the wafer. Moreover, each dielectric can be formed by a dissimilar method in order to achieve a stated result. One result is important to the planarization process: to form an interlevel dielectric having a substantially planar upper surface, wherein the interlevel dielectric is formed between the semiconductor substrate and an overlying metallization layer or between metallization layers. Thus, the interlevel dielectric provides a planar surface upon which subsequent conductive layers (metallization layers) can be formed which experience little or no step coverage problems and depth-of-focus problems.

A popular interlevel dielectric is boron phosphorous silicate glass (BPSG). BPSG can be formed as a spin-on material which is cured (or densified) after it is spun across the substrate topography. Alternatively, BPSG can be formed within a chemical vapor deposition (CVD) chamber. A popular CVD technique includes plasma enhanced or plasma assisted CVD. BPSG is well suited for placement over uneven topographies due to its low melting temperature which permits subsequent heating of the BPSG layer to "flow" the silicate across the peak and valley areas. By doping the silicate with boron and phosphorous (to form BPSG), the reflow temperature can be decreased to temperatures between 800° C. and 900° C. Any abrupt disparity between the peaks and valleys of the underlayer can be compensated by the reflow of the overlying BPSG interlevel dielectric.

Consistent with the reduction in reflow temperature, plasma enhanced formation of the BPSG structure can be performed at fairly low temperatures on the wafer. Suitable temperatures necessary to form plasma enhanced precipitates are in the range of 200° C. to 300° C. Lower temperature precipitate formation and reflow operation provide advantages in the formation of an integrated circuit. Long thermal cycles of high temperatures should be avoided in order to minimize thermal migration of impurities within the substrate.

While BPSG formed within a plasma enhanced chemical vapor deposition (PECVD) chamber provide many advantages over non-plasma assisted CVD or non-doped silicate, BPSG formation with a PECVD chamber cannot, alone, provide a highly planar dielectric structure. In instances where large disparity exists (abrupt elevational changes exist) between the upper surfaces of underlying structures, BPSG dielectrics formed within a PECVD chamber cannot achieve, in many instances, an upper dielectric surface having a "flow angle" less than 10°. The term "flow angle" is well known in the semiconductor field and generally refers to the angle taken by the dielectric upper surface as it is formed between peaks and valleys of adjacent underlayer structures. Further definition and clarification of flow angle will be provided herein below in reference to the accompanying figures. It is important to note, however, that minimization of flow angle is necessary to achieve a substantially uniform upper surface of the BPSG material. A flow angle of 0° represents a completely planar, even upper surface and should be one which a planarization process must strive to achieve.

Many conventional planarization processes utilize BPSG formed within a PECVD chamber. However, the plasma is not energized to a sufficient level necessary to achieve flow angles of less than 10° when disparities of, for example, 4000 Å or more exist. Moreover, many BPSG films are formed from a tetraethoxysilane (TEOS) source. While TEOS does provide good flow characteristics, TEOS alone cannot achieve substantially small flow angles when large underlayer disparities occur. Still further, many conventional BPSG films are densified in a nitrogen ambient. The nitrogen, while stable and relatively inert, does not enhance the flow of the BPSG at times during which silicon dioxide is precipitated. Accordingly, nitrogen ambient and low power formation of BPSG silicate often results in a substantial portion of the film being silanol (SiOH). The silanol, or derivatives of silicon (Si) or silicon oxide (SiO), is formed as an intermediate step in the deposition process. It is postulated that the silicon-rich silanol, amorphous silicon, or silicon oxide does not readily flow across the uneven topography. Instead, the silicon-rich material settles as a conformal material, taking on the surface features of the underlying material to a substantial degree. A planarized upper surface does not readily occur from the silicon-rich material. Steps must be taken to ensure that the intermediate silicon-rich compositions be minimized and that flow of the precipitates be placed in a planar fashion across the upper surface topography.

SUMMARY OF THE INVENTION

The problems outlined above are in large part solved by the BPSG planarization structure of the present invention. The BPSG structure hereof is formed within a PECVD chamber utilizing high energy plasma necessary to complete the breaking of bonds between the source gas material in order to achieve a final film substantially comprising silicon dioxide ($SiO_2$). The higher energy plasma ensures that minimal intermediate compositions of silicon-rich material exists. If any intermediates occur, the intermediates occur primarily in the plasma and not on the upper surface of the semiconductor substrate. It is discovered that by increasing the RF power above approximately 950 watts, the plasma is sufficiently energized to achieve substantial reduction in flow angle of the resulting film.

The present invention further contemplates use of oxygen within the furnace used for densifying the BPSG film. Oxygen atoms provide a greater affinity to the boron or phosphorous within the BPSG structure and also provide more available atoms to the silicon atoms already prevent in the BPSG. It is postulated that the available oxygen atoms help enhance silicon dioxide formation and thereby aid the reduction of silicon-rich intermediates. It is further postulated that the substitution of the boron and phosphorous is facilitated by the oxygen in order to enhance or increase BPSG flow across the wafer surface.

Broadly speaking, the present invention contemplates a method for forming a planarization structure upon a wafer. The method comprises the steps of providing a wafer surface having a plurality of conductors and trenches respectively formed upon and within the wafer surface. The wafer is inserted into a PECVD chamber having an RF electrode, and a gaseous source of silicon oxide and impurities is inserted into the chamber. A plasma-derived precipitate of dielectric material is formed upon the wafer surface by applying power exceeding 950 watts to the RF electrode. The wafer is then heated in an oxygen ambient at a temperature exceeding 800° C. to simultaneously densify and reflow the material to a phase of substantially silicon dioxide having a flow angle less than 10°.

Preferably, the gaseous source of silicon comprises a silane gas. The gaseous source of oxygen comprises an oxygen-containing gas and the gaseous source of impurities comprises a boron- and phosphorous-containing gas. The dielectric material is selected from the group consisting of amorphous Si, SiO, SiOH, and mixtures of same. During the densification of the dielectric material, oxygen atoms are provided to the material, wherein the material comprises SiOH bonds, and wherein the oxygen atoms displace H from the SiOH to form silicon dioxide. The dielectric material may also comprise Si, and oxygen atoms are added to the Si to form silicon dioxide. The dielectric material may further comprise non-stoichiometric silicon dioxide, and the silicon atoms combine with the non-stoichiometric silicon dioxide to from stoichiometric silicon dioxide.

Heating of the wafer in an oxygen ambient includes numerous steps. Initially the wafer is inserted into a furnace, wherein the furnace is heated between 700° C. to 800° C. and is supplied with $N_2$ at a flow rate of approximately 10 to 20 slm. Next, the temperature of the furnace is increased to approximately 900° C. for a first period of time. While maintaining the elevated temperature, $N_2$ is then evacuated and thereafter $O_2$ is inserted into the furnace at a flow rate of approximately 4 to 7 slm. for a second period of time. While maintaining the elevated temperature, the $O_2$ is then evacuated and $N_2$ is thereafter re-inserted into the furnace at a flow rate of approximately 10 to 20 slm. for a third period of time. The temperature of the furnace is then decreased to approximately 700° C. to 800° C. for a fourth period of time. The first period of time is less than the fourth period of time, and the second period of time is less than the third period of time.

The present invention still further contemplates a method for forming planarization structure upon a wafer surface. The method comprises the steps of providing a plasma enhanced CVD chamber having an RF electrode charged to a power level exceeding 950 watts. A precipitate of dielectric material is then deposited upon a wafer surface comprising a plurality of conductors and trenches respectively formed upon and within the wafer surface. The conductors and trenches form an elevation level disparity exceeding 4000 Angstroms. The disparity between a conductor and the underlying substrate surface is generally in the range of 3000 Angstroms to 5000 Angstroms. If conductors are stacked, as in an EEPROM application, the disparity can be in the range of 6000 Angstroms to 8000 Angstroms. After the dielectric is deposited upon the uneven surface, the wafer is then heated at a first temperature level in the presence of $N_2$ to covert a first portion of the precipitate to a phase of substantially silicon dioxide having a flow angle less than 40°. The silicon dioxide is then etched to a specific depth above the conductors with a photolithography mask used to form the conductors. The wafer is then heated at a second temperature above the first temperature in the presence of $O_2$ to covert a second portion greater than the first portion of the precipitate to a phase of substantially silicon dioxide having a flow angle less than 10°, and in many instances less than 2°.

BRIEF DESCRIPTION OF THE DRAWINGS

Other objects and advantages of the invention will become apparent upon reading the following detailed description and upon reference to accompanying drawings in which:

FIGS. 8–10 are cross-sectional views of a semiconductor wafer at various processing steps used to form a planar BPSG layer according to the present invention when stacked conductor underlayers are encountered.

Figure 1:
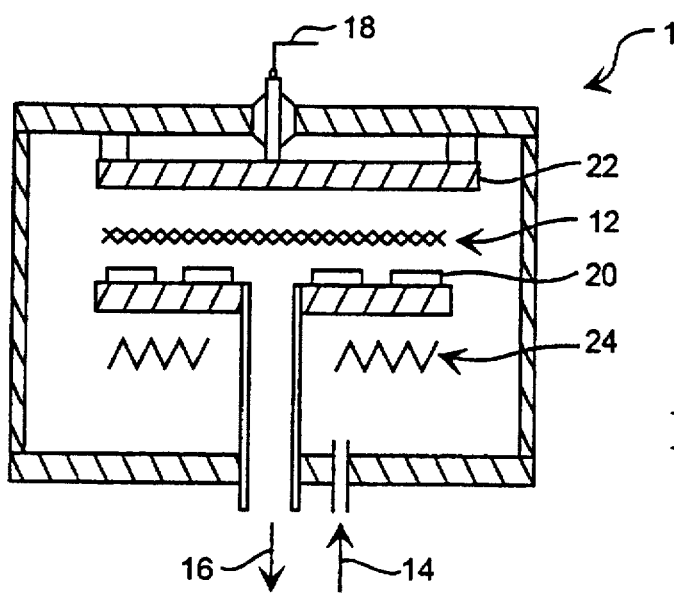
FIG. 1 is a partial cross-sectional view of a PECVD chamber with inlet and outlet flow and power capability according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents, and alternatives falling within the spirit and scope of the present invention as defined by the appended claims.

DETAILED DESCRIPTION OF THE INVENTION

Turning now to FIG. 1, a partial cross-sectional view of a PEVCD chamber 10 is shown. Chamber 10 comprises a plasma generating section 12, a gas introduction section 14, a vacuum system 16 and a power source 18. Most commercially available PECVD chambers 10 are either inductive (coil coupled) or capacitive (diode or parallel-plate) chambers. Either type of coupling methodology can be used to form plasma 12 (or glow discharge). Plasma 12 generally includes, in addition to free electrons, normal neutral gas molecules, gas molecules that have become ionized, ionized fragments of broken-up gas molecules, and free radicals. Deposition (or precipitation) from plasma 12 upon wafers 20 occurs when the molecules of incoming gases are broken-up in the plasma and the appropriate ions are recombined at the wafer surface. In the plasma, high-energy electrons exist that can impart sufficient energy to reaction gases for reactions that normally take place only at high temperatures to proceed near room temperature or slightly above room temperature.

To begin the plasma deposition process, chamber 10 is evacuated to a pressure of approximately 2.0 Torr, and RF power is applied to electrode 22 via source 18. An RF energy exceeding 950 watts, and in some instances exceeding 1200 watts is applied to electrode 22 at a frequency generally within the range of 50 kHz to 13.56 MHz or above. Auto-tuning and auto-power control circuits can be used to maintain the power level and frequency. While PECVD reactions occur at lower temperature than normal CVD reactions, a heater 24 is often used to maintain the lower temperature reaction. Heater 24 ensures that the precipitation temperature upon wafer 20 is maintained at approximately 200° C. to 300° C. Normal CVD precipitation temperatures far exceed the PECVD temperatures and, in some instances, can reach the level of 900° C. to 1200° C. for silicon dioxide formation.

Figure 2:
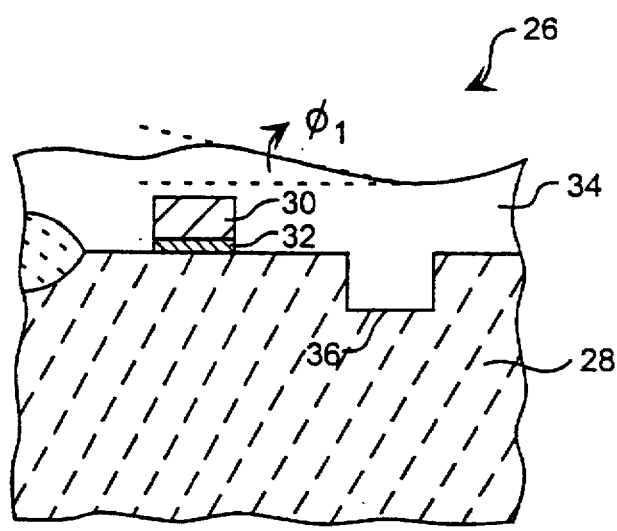
FIG. 2 is a cross-sectional view of a semiconductor wafer having a BPSG layer formed at a flow angle $\phi_1$ upon the wafer upper surface according to the present invention.

Referring now to FIG. 2, a cross-sectional view of a semiconductor wafer 26 is shown. Wafer 26 includes a silicon substrate having an uneven upper surface. The upper surface is generally formed by one or more conductors 30 (metal or, as shown in FIG. 2, polysilicon). If the conductor is a polysilicon gate, then a gate oxide 32 is formed prior to polysilicon deposition. The conductors form peaks upon which a subsequently deposited dielectric layer 34 is formed. The upper surface may also include one or more trenches 36, such that the upper surface consists of a significant disparity between the peaks (at the upper surface of the conductors) and the valleys (at the lower surface of the trench). The disparity can, in many instances, exceed 4000 Å and, if dielectric layer 34 is not properly formed, a significantly large flow angle $\phi_1$ can occur. If flow angle $\phi_1$ is large, e.g., greater than 10° to 20°, then step coverage problems and depth-of-focus problems can occur. As a result of the process for fabricating dielectric layer 34, flow angle $\phi_1$ can be maintained less than 10° even when disparity between peaks and valleys of the underlying substrate surface is to 4000 Å. If the disparity is less than 2000 Å, then planarization is usually achieved using conventional dielectric formation techniques.

Figure 3:
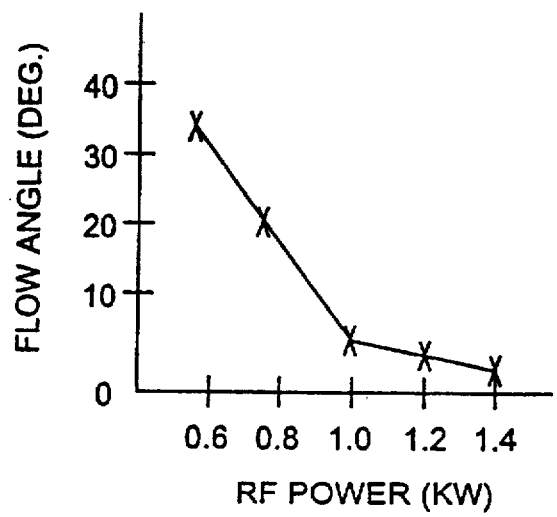
FIG. 3 is a graph of flow angle versus RF power of actual readings taken from numerous BPSG samples formed according to the present invention.

Referring now to FIG. 3, a graph of flow angle versus RF power of actual readings taken from numerous BPSG samples are shown. Specifically, dielectric layer 34 is formed on many silicon substrates 28 having upper surface disparity of approximately 7000 Å. Dielectric layer 34 is formed according to the process described herein below in order to minimize flow angle $\phi_1$. Each substrate sample and corresponding layer 34 is formed in a PECVD chamber 10 using dissimilar RF power on electrode 22. The RF power is increased at terminal 18 according to the values shown in FIG. 3 to produce a corresponding decrease in flow angle $\phi_1$. As shown, a linear decrease in flow angle occurs within the 600 watts to 1000 watts range. A lesser linear decrease occurs in the range of 1000 watts to 1400 watts range. By increasing RF power to 800 watts, flow angle is reduced to less than 20°. However, by increasing RF power to approximately 950 watts, less than 10° flow angle occurs. The graph of FIG. 3 illustrates the significant decrease in flow angle to 1000 watts thereby making 600–1000 watt-range plasma energies of greatest marginal improvement over lower RF energies. Accordingly, increasing RF energy of electrode 22 is found to be instrumental in the reduction of flow angle of layer 34 resulting from plasma deposition on a substrate surface of approximately 7000 Å disparity.

Figure 4:
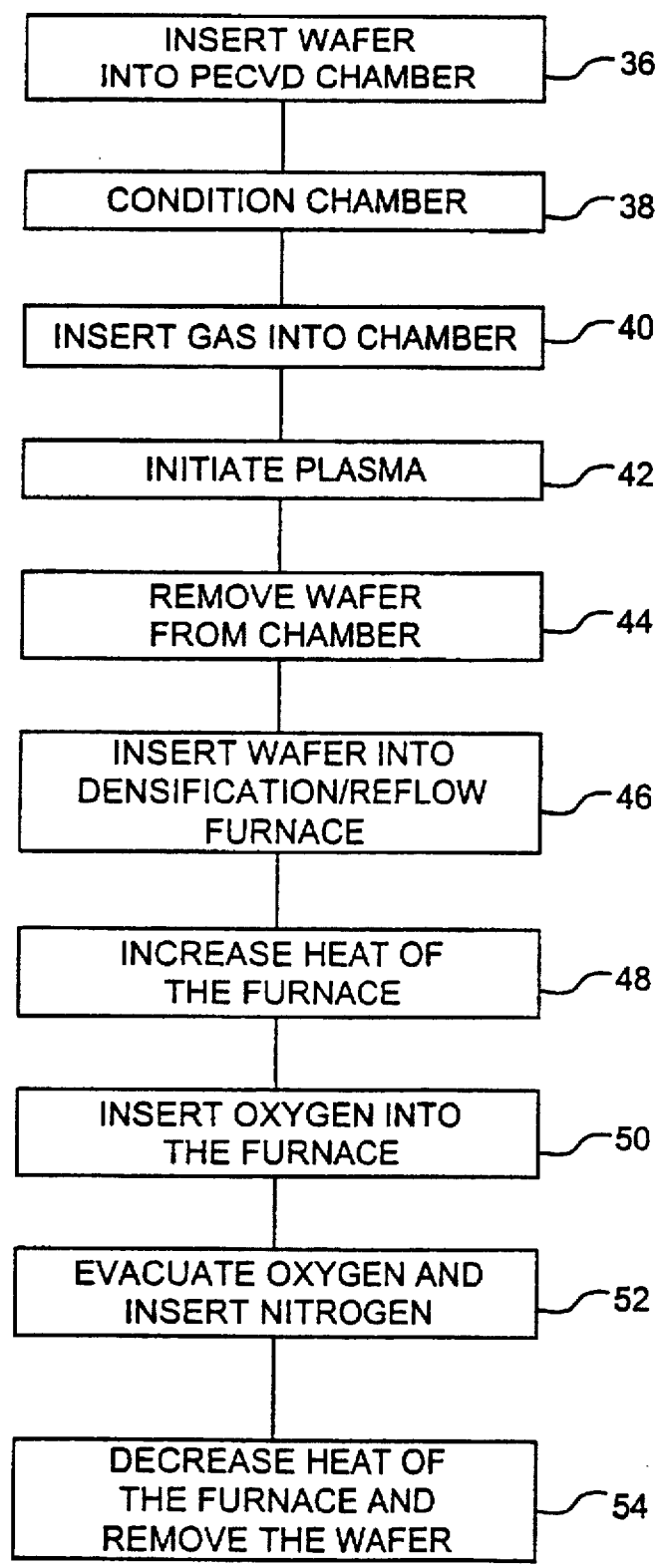
FIG. 4 is a flow diagram illustrating the process of the present invention.

While high energy plasma demonstrates an encouraging result upon uneven substrates, it is also necessary to maintain close control of the dielectric layer formation. Specifically, the process steps shown in FIG. 4 illustrate the structure and methodology necessary to form an enhanced planarized layer 34 having reduced flow angle characteristics. In particular, FIG. 4 illustrates step 36 of placing a wafer into a PECVD chamber 10. Next, chamber 10 is conditioned at step 38 by heating and evacuating the chamber to the necessary temperature and pressure levels described above. Once the temperature and pressure levels are stabilized, a gaseous source of silicon, oxygen and impurities are inserted into the chamber as shown in step 40. Importantly, the gaseous source of silicon is silane ($SiH_4$). The gaseous source of oxygen is preferably $N_2O$. The gaseous source of impurities comprises both phosphorous and boron and, preferably, is $PH_3$ and $B_2H_6$, respectively. Silane is inserted into chamber 10 at a flow rate of approximately 0.18 slm., $N_2O$ is inserted at a flow rate of approximately 6.0 slm., $PH_3$ is inserted at a flow rate of approximately 0.45 slm., and $P_2H_6$ is inserted at a flow rate of approximately 1.0 slm.

Once the gaseous source material is placed into chamber 10, a plasma is initiated by applying an RF power to electrode 22. An ensuing plasma-deposited layer comprises a major amount of silanol (SiOH) or amorphous silicon oxide or silicon whenever the applied RF power is less than approximately 600 watts. However, if the applied power exceeds 950 watts, then a majority of the ensuing plasma-deposited layer is silicon dioxide. By increasing the RF power, not only is flow angle decreased (as shown in FIG. 3), but also the resulting properties of the plasma-deposited material are enhanced. Namely, it is postulated that fewer intermediate silanol bonds are formed on the substrate surface. Intermediates are formed within the plasma and evacuated from chamber 10 via vacuum system 16 instead of being deposited or precipitated upon the substrate. A result being a substrate that receives higher quality stoichiometric silicon dioxide directly formed from the gases broken-up in the plasma and recombined at the substrate surface.

After the plasma initiation step 42 is complete, the wafer is removed from chamber 10, as shown in step 44. The wafer can then be inserted into a furnace, such as a diffusion furnace or anneal furnace. The furnace provides simultaneous densification and reflow of the BPSG layer 34 in order to further provide predominant amounts of silicon dioxide having a more planar upper surface than the non-densified material. Densification/reflow step 46 generally includes heating the chamber to approximately 700° C. to 800° C. and then inserting the wafer into the chamber. The chamber is allowed to stabilize at the desired 700° C. to 800° C. range in the presence of a nitrogen ambient. Nitrogen is maintained within the furnace at a flow rate of approximately 15 slm. Thereafter, the temperature of the furnace is increased at step 48 to approximately 900° C. while maintaining nitrogen flow rate. Increase in furnace heat is maintained for a first period of time, thereafter oxygen is inserted into the furnace simultaneously with nitrogen evacuation. As shown in step 50, oxygen is inserted for a second period of time while the elevated temperature is maintained. After the second period of time has expired, oxygen is removed from the furnace, and nitrogen is inserted. Removal of oxygen and insertion of nitrogen is maintained for a third period of time while the elevated temperature is also maintained as shown in step 52. Thereafter, the furnace temperature is reduced to approximately 700° C. to 800° C. while maintaining constant nitrogen flow. The wafer can thereafter be removed from the furnace as shown by step 54. The oxygen flow rate of approximately 12 slm. during step 50 can be adjusted to some degree; however, nitrogen flow rate of approximately 15 slm. maintained throughout the steps is needed to compensate for decrease in oxygen flow.

Figure 5:
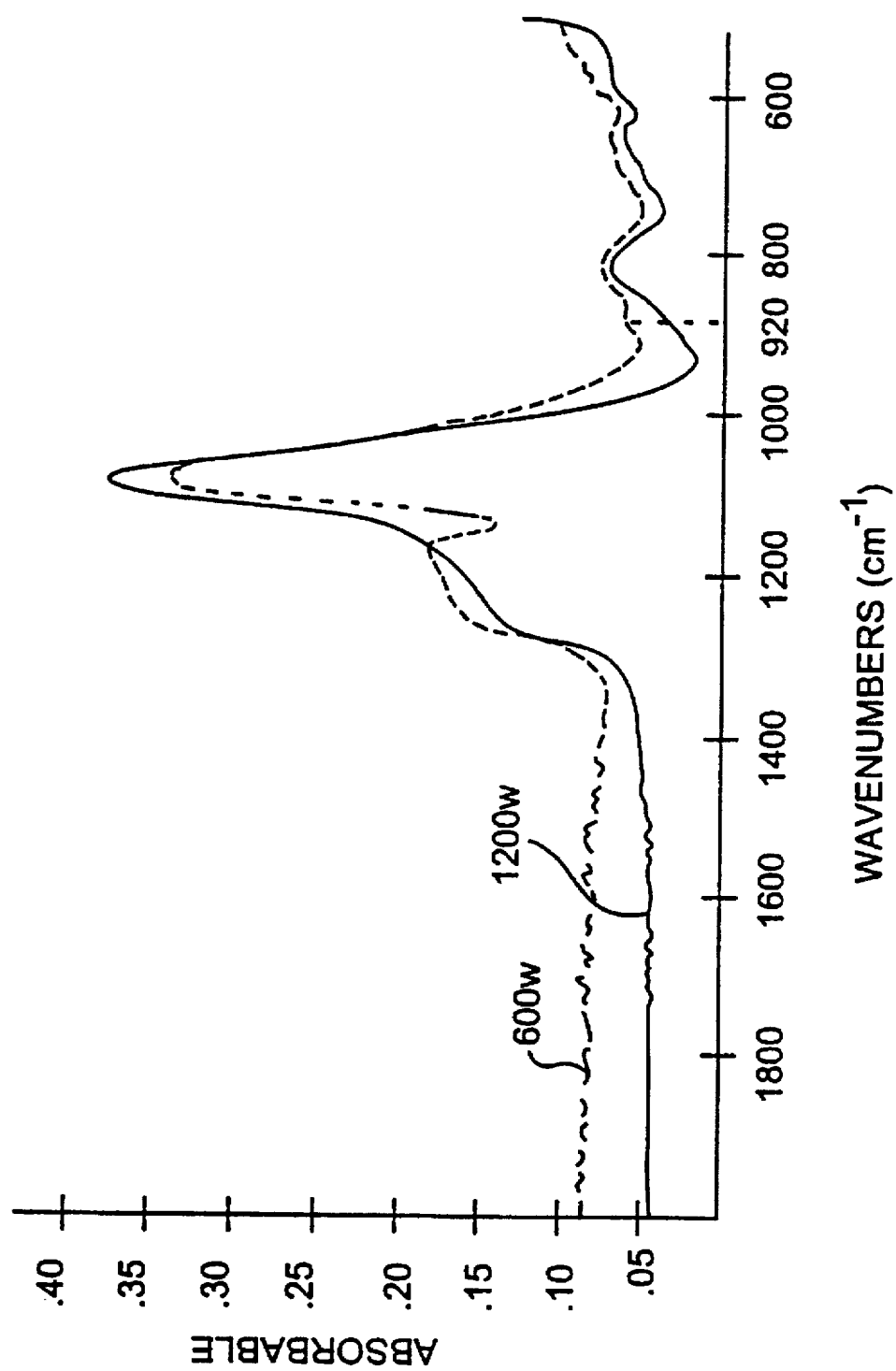
FIG. 5 is a graph of infra-red absorption spectra comparing actual low energy plasma-derived and high energy plasma-derived $SiO_x$ layer formed according to the present invention.

Referring now to FIG. 5, an infra-red absorption spectra is shown of an actual dielectric ($SiO_x$) layer formed according to the process steps of FIG. 4. In particular, FIG. 5 illustrates Fourier transform infra-red (FTIR) spectra of silanol peak (wave number 920 $cm^{-1}$. FTIR analysis of the undoped silicate glass layer illustrates the relative dissimilarity of Si—OH bonds at 920 $cm^{-1}$ taken at 600 watts and 1200 watts profiles. When RF energies are increased to 1200 watts, 920 $cm^{-1}$ wave number corresponding to Si—OH bond spectra indicates lesser Si—OH bonds in the BPSG. FIG. 5 therefore illustrates that fewer silanol bonds are formed as intermediate in the higher energy BPSG formation process. It is postulated that a film of higher silanol bonds equates with a silicon-rich intermediary material, and that the silicon-rich material is less susceptible to flow across the silicon substrate. Without being bound to theory, by increasing RF energies to 1200 watts, as shown in FIG. 5, silicon-rich material is reduced and it is contemplated that higher flow rates are achieved. Higher flow rates correspond with a smoother upper surface (one which has a lesser flow angle) of the ensuing BPSG product.

Figure 6A:
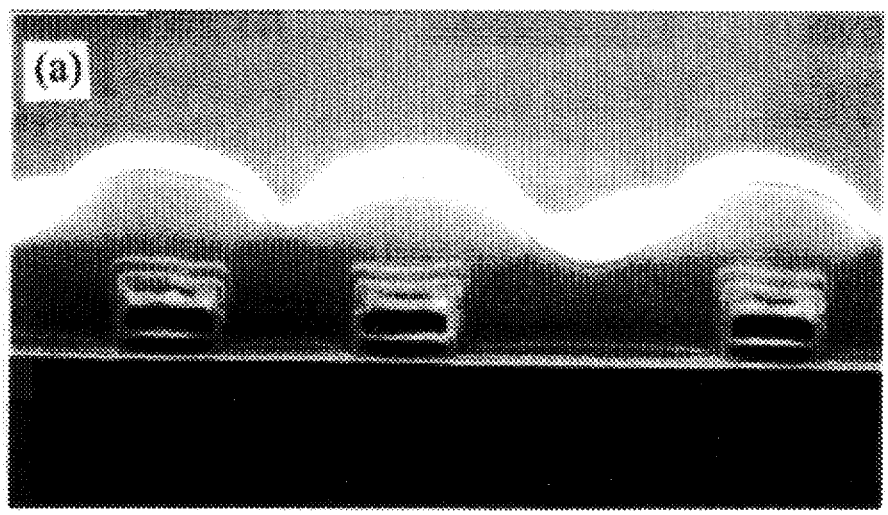
FIGS. 6a and 6b are scanning electron microscope (SEM) photographs taken of an actual BPSG layer formed in a nitrogen densification furnace compared with an actual BPSG layer formed in an oxygen densification furnace according to the present invention.
Figure 6B:
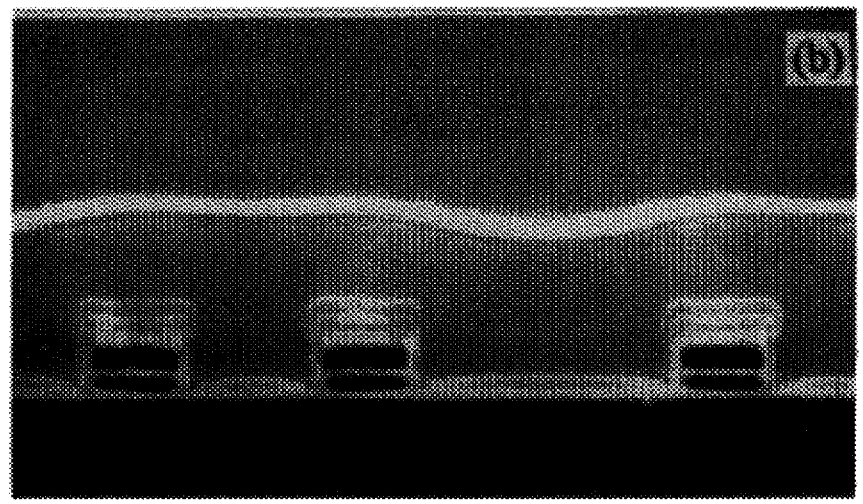

Referring now to FIGS. 6a and 6b, scanning electron microscope (SEM) photographs of actual BPSG layers are shown. Specifically, FIG. 6a illustrates a SEM photograph taken of a BPSG layer formed within a PECVD chamber and subsequently densified solely within a nitrogen ambient. Numerous hills and valleys are shown at the upper surface of BPSG layer 34. FIG. 6b illustrates a SEM photograph of a BPSG layer formed within a PECVD chamber and subsequently densified in an oxygen ambient (instead of a nitrogen ambient). The oxygen ambient, previously discussed as step 50 in FIG. 4, provides a relatively smooth upper surface BPSG layer 34 having a flow angle shown in FIG. 6b less than the flow angle of the nitrogen-ambient densified material shown in FIG. 6a. Accordingly, oxygen ambient provides an advance in BPSG planarization at the densification/reflow stage. BPSG layer 34, of FIG. 6b, is formed according to the process steps shown in FIG. 4.

Figure 7A:
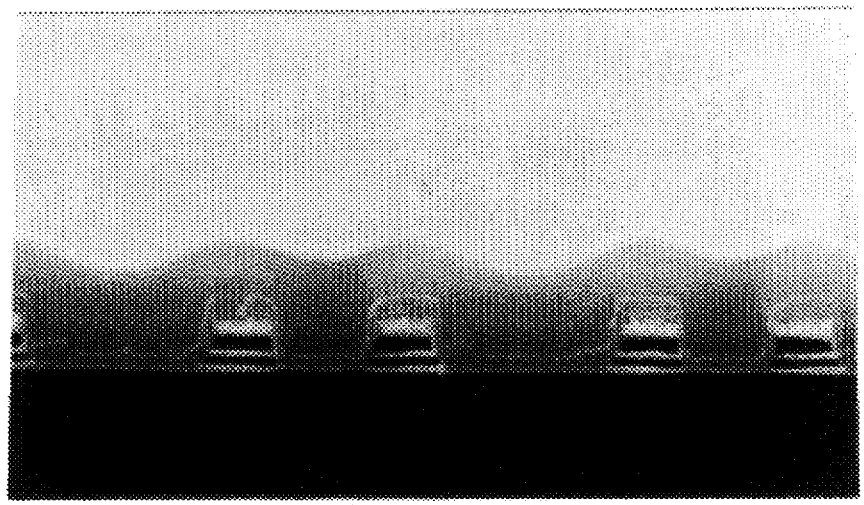
FIGS. 7a and 7b are scanning electron microscope (SEM) photographs taken of an actual BPSG layer formed in a oxygen densification furnace and at 600 watt RF power and at 1200 watt RF power according to the present invention.
Figure 7B:
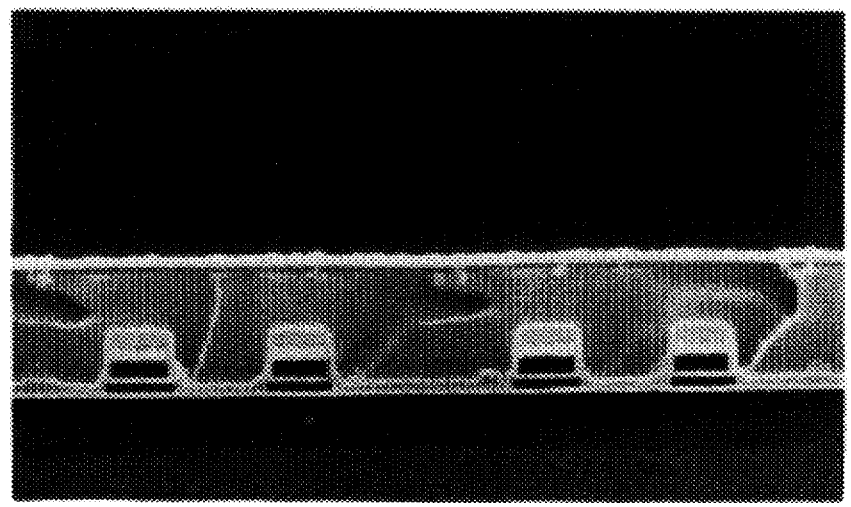

Referring now to FIGS. 7a and 7b, SEM photographs are shown of an actual BPSG layer according to the process steps of FIG. 4. FIG. 7a, however, illustrates BPSG layer 34 formed at an RF power of 600 watts, while FIG. 7b illustrates BPSG layer 34 formed at an RF power of 1200 watts. In both instances, BPSG layer 34 is densified in an oxygen ambient. As appreciated from the drawings of 6a, 6b, 7a and 7b, densification in oxygen provides suitable advantage over nitrogen densification. However, densification in oxygen as well as high power RF energy provides an even greater planarization of the upper surface of BPSG 34. FIG. 7b illustrates a flow angle of approximately 0° (near ideal) using the process steps of FIG. 4 (oxygen densification and high RF power) described above. BPSG is formed in FIG. 7b over an underlying substrate topography of stacked conductors having peak and valley disparity of approximately 7000 Å.

Referring now to FIGS. 8–10, it appreciated that in many instances, the peak and valley disparities can exceed 4000 Å and, in EEPROM applications, the disparity can reach 7000 to 8000 Å. In instances where stacked conductors 56 and 58 (EEPROM configuration) are encountered, then the disparity between the upper surface of the upper conductor 58 and substrate 28 upper surface can be substantial. In such instances, the process flow of FIG. 4 utilizing high energy RF power (exceeding 950 watts) and oxygen densification remains insufficient to fully planarize severe disruption in underlying disparity elevation levels. Flow angle $\phi_2$ can thereby exceed 10°, in such instances. In order to fully planarize the structure shown in FIG. 8, subsequent processing steps are needed. Namely, select etch 60 of raised portions 62 may be necessary.

The etching operation, shown in FIG. 9, can be effectuated by utilizing the existing mask used to form conductor 58. A photoresist (not shown) is deposited across the upper surface of the BPSG layer 34. The photoresist is of opposite polarity to the photoresist normally used to process other layers, and specifically, layer 58. Thus, the negative polarity photoresist can be used to remove (as opposed to retain) area 60 overlying, and in registry with, conductor 58. The etch process can be timed such that it is stopped prior to exposing the upper surface of conductor 58. The resulting upper surface of layer 34 includes smaller raised surfaces, or protrusions 64, which can then be removed during a subsequent densification/reflow process, as shown in FIG. 10. Reflow in the presence of an oxygen ambient helps ensure that the protruding edges 62 are smoothed as a result of the reflow temperature exceeding BPSG softening threshold. Additionally, oxygen ambient helps to enhance the reflow operation necessary to achieve a flow angle $\phi_2$, shown in FIG. 10, of approximately 0°.

It will be appreciated to those skilled in the art having the benefit of this disclosure that this invention is believed to be capable of applications with numerous types of integrated circuits embodied within a semiconductor substrate. Furthermore, it is also to be understood that the form of the invention shown and described is to be taken as a presently preferred embodiment. Various modifications and changes may be made to each and every processing step as would be obvious to a person skilled in the art without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A method for forming a planarization structure upon a wafer, comprising the steps of:

providing a wafer surface comprising a plurality of conductors and trenches respectively formed upon and within said wafer surface;

inserting said wafer into a PECVD chamber having an RF electrode, and inserting a gaseous source of silicon, oxygen and impurities into said chamber;

forming a plasma-derived precipitate of dielectric material upon said wafer surface by applying power exceeding 950 watts to said RF electrode; and heating said wafer in an oxygen ambient at a temperature exceeding 800° C. to simultaneously densify and reflow said material to a phase of substantially silicon dioxide having a flow angle less than 10 degrees.

2. The method as recited in claim 1, wherein said conductors and trenches form an elevation level disparity at said wafer surface of less than 4000 Angstroms.

3. The method as recited in claim 1, wherein said gaseous source of silicon comprises a silane gas, said gaseous source of oxygen comprises an oxygen-containing gas, and said gaseous source of impurities comprises a boron- and phosphorous-containing gas.

4. The method as recited in claim 1, wherein said dielectric comprises material selected from the group consisting of amorphous Si, SiO, SiOH, and mixtures of same.

5. The method as recited in claim 1, wherein said heating step comprises providing oxygen atoms to said dielectric material, wherein said dielectric comprises SiOH bonds and wherein said heat step displaces H from said SiOH to form said silicon dioxide.

6. The method as recited in claim 1, wherein said heating step comprises providing oxygen atoms to said dielectric material, wherein said dielectric material comprises Si to form said silicon dioxide.

7. The method as recited in claim 1, wherein said heating step comprises providing oxygen atoms to said dielectric material, wherein said dielectric material comprises non-stoichiometric silicon dioxide to form stoichiometric said silicon dioxide.

8. The method as recited in claim 1, wherein said heating step comprises:

inserting said wafer into a furnace, wherein said furnace is heated between 700° C. to 800° C. and is supplied with $N_2$ at a flow rate of approximately 10 to 20 slm.;

increasing the temperature of said furnace to approximately 900° C. for a first period of time;

while maintaining said elevated temperature, evacuating said $N_2$ and thereafter inserting $O_2$ into said furnace at a flow rate of approximately 4 slm. to 7 slm. for a second period of time;

while maintaining said elevated temperature, evacuating said $O_2$ and thereafter re-inserting $N_2$ into said furnace at a flow rate of approximately 10 to 20 slm. for a third period of time; and decreasing said temperature of said furnace to approximately 700° C. to 800° C. for a fourth period of time and thereafter removing said wafer from said furnace.

9. The method as recited in claim 8, wherein said first period of time is less than said fourth period of time, and said second period of time is less than said third period of time.

10. A method for forming a silane based BPSG planarization structure upon a wafer comprising the steps of:

providing a wafer surface comprising a plurality of conductors and trenches respectively formed upon and within said wafer surface, wherein said conductors and trenches form an elevation level disparity at said wafer surface of less than 4000 Angstroms;

inserting said wafer into a PECVD chamber having an RF electrode, and inserting silane gas, oxygen-containing gas, boron-containing gas and phosphorous-containing gas into said chamber;

applying power exceeding 950 watts to said RF electrode and heating said chamber to form a plasma-derived precipitate of dielectric material upon said wafer surface;

removing said wafer from said chamber and thereafter inserting said wafer into a furnace heated between 700° C. to 800° C. and filled with $N_2$ at a flow rate of approximately 10 to 20 slm.;

increasing the temperature of said furnace to approximately 900° C. for a first period of time; and while maintaining said elevated temperature, evacuating said $N_2$ and thereafter inserting $O_2$ into said furnace at a flow rate of approximately 4 slm. to 7 slm. for a second period of time to densify and simultaneously reflow said material to a phase of substantially silicon dioxide having a flow angle less than 10 degrees.

11. The method as recited in claim 10, wherein said dielectric comprises material selected from the group consisting of amorphous Si, SiO, SiOH, and mixtures of same.

12. The method as recited in claim 10, wherein said step of evacuating said $N_2$ and thereafter inserting $O_2$ further comprises the step of displacing H bonds of SiOH within said dielectric material to form said silicon dioxide.

13. The method as recited in claim 10, wherein said step of evacuating said $N_2$ and thereafter inserting $O_2$ further comprises the step of converting non-stoichiometric silicon dioxide to form stoichiometric said silicon dioxide.

14. The method as recited in claim 10, further comprising the steps of:

while maintaining said elevated temperature, evacuating said $O_2$ and thereafter re-inserting $N_2$ into said furnace at a flow rate of approximately 10 to 20 slm. for a third period of time; and decreasing said temperature of said furnace to approximately 700° C. to 800° C. for a fourth period of time and thereafter removing said wafer from said furnace.

15. The method as recited in claim 14, wherein said first period of time is less than said fourth period of time, and said second period of time is less than said third period of time.

16. A method for forming a planarization structure upon a wafer surface comprising the steps of:

providing a plasma enhanced CVD chamber having an RF electrode charged to a power level exceeding 950 watts;

depositing a precipitate of dielectric material from said chamber upon a wafer surface comprising a plurality of conductors and trenches respectively formed upon and within said wafer surface, wherein said conductors and trenches form an elevation level disparity in the range of 4000 Angstroms to 7000 Angstroms;

heating said wafer surface at a first temperature level in the presence of $N_2$ gas to convert a first portion of said precipitate to a phase of substantially silicon dioxide having a flow angle less than 40 degrees;

etching said silicon dioxide to a specified depth above said conductors with a photolithography mask used to form said conductors; and heating said wafer surface at a second temperature above said first temperature in the presence of $O_2$ to convert a second portion greater than said first portion of said precipitate to a phase of substantially silicon dioxide having a flow angle less than 10 degrees.

17. The method as recited in claim 16, wherein said etching step comprises opening a window through reverse-polarity photoresist overlying said conductors and etching said precipitate within said window a distance perpendicular said wafer surface, wherein said distance is within the range of 2000 Angstroms to 3000 Angstroms.

18. The method as recited in claim 16, wherein said precipitate is a dielectric comprising material selected from the group consisting of amorphous Si, SiO, SiOH, and mixtures of same.

19. The method as recited in claim 16, wherein said second heating step comprises providing oxygen atoms to said precipitate, wherein said precipitate comprises SiOH bonds and wherein said second heat step displaces H from said SiOH to form said silicon dioxide.

20. The method as recited in claim 16, wherein said heating step comprises providing oxygen atoms to said precipitate, wherein said precipitate comprises Si to form said silicon dioxide.

21. The method as recited in claim 16, wherein said heating step comprises providing oxygen atoms to said precipitate, wherein said precipitate comprises non-stoichiometric silicon dioxide to form stoichiometric said silicon dioxide.

\* \* \* \* \*